United States Patent
Oomori

(10) Patent No.: US 10,355,619 B2
(45) Date of Patent: Jul. 16, 2019

(54) SEMICONDUCTOR MODULE

(71) Applicant: SUMITOMO ELECTRIC INDUSTRIES, LTD., Osaka (JP)

(72) Inventor: Hirotaka Oomori, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/076,444

(22) PCT Filed: Jan. 18, 2017

(86) PCT No.: PCT/JP2017/001565
§ 371 (c)(1),
(2) Date: Aug. 8, 2018

(87) PCT Pub. No.: WO2017/159029
PCT Pub. Date: Sep. 21, 2017

(65) Prior Publication Data
US 2019/0052189 A1    Feb. 14, 2019

(30) Foreign Application Priority Data
Mar. 15, 2016    (JP) ................................ 2016-051414

(51) Int. Cl.
*H02M 7/48*      (2007.01)
*H02M 7/537*     (2006.01)
(Continued)

(52) U.S. Cl.
CPC ............ *H02M 7/537* (2013.01); *H01L 25/07* (2013.01); *H01L 25/18* (2013.01); *H02M 1/32* (2013.01);
(Continued)

(58) Field of Classification Search
CPC .......... H02M 1/34; H02M 7/537; H02M 1/32; H02M 7/5387; H02M 7/003; H02M 7/48;
(Continued)

(56) References Cited

U.S. PATENT DOCUMENTS

2013/0056755 A1* 3/2013 Hatai ................ H01L 23/49805
257/77
2013/0341776 A1* 12/2013 Drobnik .............. H01L 23/5385
257/675

FOREIGN PATENT DOCUMENTS

| JP | 2005-251839 | 9/2005 |
|----|-------------|--------|
| JP | 2015-135895 | 7/2015 |
| JP | 2015-223047 | 12/2015 |

* cited by examiner

*Primary Examiner* — Yusef A Ahmed
*Assistant Examiner* — Bryan R Perez
(74) *Attorney, Agent, or Firm* — Ipusa, PLLC

(57) ABSTRACT

A semiconductor module according to an embodiment includes an insulating substrate having a power conversion circuit mounted thereon, a first transistor constituting an upper arm, a second transistor constituting a lower arm, a first input interconnection pattern coupled to a positive-side input terminal, a second input interconnection pattern coupled to a negative-side input terminal, an output interconnection pattern coupled to an output terminal, and an absorbing device configured to absorb surge voltage, wherein the first input interconnection pattern includes a first-transistor mounting area on which the first transistor is mounted, wherein the output interconnection pattern includes a second-transistor mounting area on which the second transistor is mounted, wherein the second input interconnection pattern includes an absorbing-device connecting area disposed between the first and second transistor mounting areas, and wherein the absorbing-device connect- (Continued)

ing area is electrically coupled to the first-transistor mounting area through the absorbing device.

6 Claims, 9 Drawing Sheets

(51) Int. Cl.
*H01L 25/07* (2006.01)
*H01L 25/18* (2006.01)
*H02M 1/34* (2007.01)
*H02M 1/32* (2007.01)
*H02M 7/00* (2006.01)
*H02M 7/5387* (2007.01)

(52) U.S. Cl.
CPC ............ *H02M 1/34* (2013.01); *H02M 7/003* (2013.01); *H02M 7/48* (2013.01); *H02M 7/5387* (2013.01); *H01L 2224/48091* (2013.01); *H01L 2224/48247* (2013.01); *H01L 2224/49113* (2013.01); *H02M 2001/348* (2013.01)

(58) Field of Classification Search
CPC ... H01L 25/18; H01L 25/043; H01L 25/0657; H01L 25/07; H01L 2224/49113; H01L 2224/48247; H01L 2224/48091
USPC ........... 257/676, 777, E23.04, E23.037, 672, 257/685–686
See application file for complete search history.

US 10,355,619 B2

SEMICONDUCTOR MODULE

TECHNICAL FIELD

The disclosures herein relate to a semiconductor module.

The present application claims priority based on Japanese application No. 2016-051414 filed on Mar. 15, 2016, the entire contents of which are hereby incorporated by reference.

BACKGROUND ART

It is known that in a semiconductor module having a power conversion circuit such as an inverter circuit, surge voltage occurs between the positive-side input terminal and the negative-side input terminal of the power conversion circuit immediately after turning on or off switching-element transistors constituting the upper arm and the lower arm. In order to reduce the surge voltage, a snubber capacitor serving as a surge voltage absorbing device is placed between the positive-side input terminal and the negative-side input terminal in Patent Document 1.

RELATED-ART DOCUMENTS

Patent Document

[Patent Document 1] Japanese Patent Application Publication No. 2015-135895

SUMMARY OF THE INVENTION

A semiconductor module according to an aspect of the present disclosures is a semiconductor module including a power conversion circuit, and includes an insulating substrate, a first transistor constituting an upper arm of the power conversion circuit, a second transistor constituting a lower arm of the power conversion circuit and electrically series-coupled to the first transistor, a first input interconnection pattern disposed on the insulating substrate and coupled to a positive-side input terminal for supplying positive power to the power conversion circuit, a second input interconnection pattern disposed on the insulating substrate and coupled to a negative-side input terminal for supplying negative power to the power conversion circuit, an output interconnection pattern disposed on the insulating substrate and coupled to an output terminal for outputting output power of the power conversion circuit, and an absorbing device configured to absorb surge voltage in the power conversion circuit, wherein the first input interconnection pattern includes a first-transistor mounting area on which the first transistor is mounted, wherein the output interconnection pattern includes a second-transistor mounting area on which the second transistor is mounted, wherein the second input interconnection pattern includes an absorbing-device connecting area that is disposed between the first-transistor mounting area and the second-transistor mounting area, and wherein the absorbing-device connecting area is electrically coupled to the first-transistor mounting area through the absorbing device.

MODE FOR CARRYING OUT THE INVENTION

Figure 1:
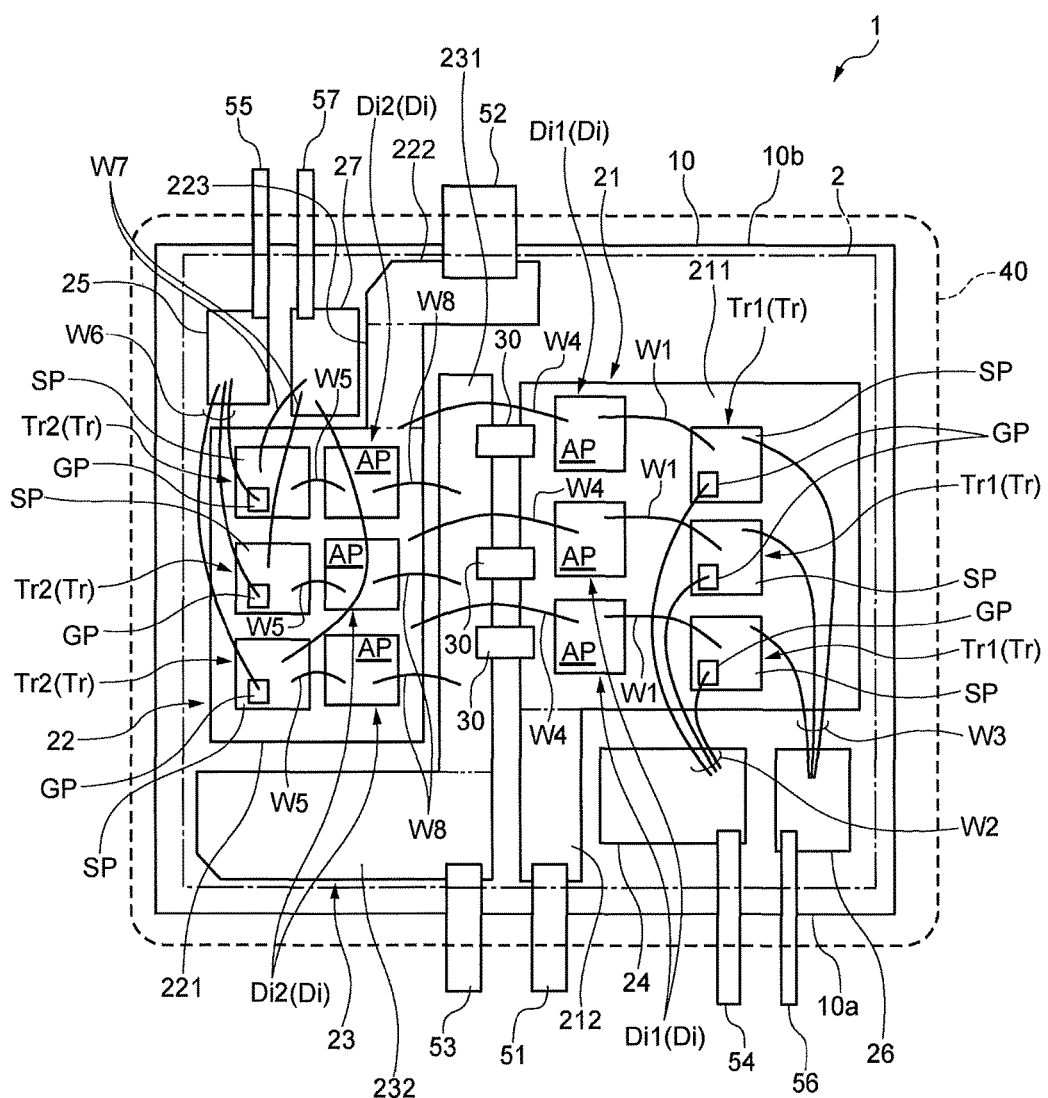
FIG. 1 is a plan view illustrating a schematic configuration of a semiconductor module according to an embodiment.
Figure 1:
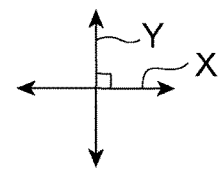

In the technology disclosed in Patent Document 1, the part on which the transistors are mounted and the part on which the snubber capacitor is mounted are separately formed on the substrate on which the switching-element transistors or the like are mounted, thereby thermally separating these parts from each other, in order to prevent degradation caused by heat from the snubber capacitor (i.e., surge voltage absorbing device). In such a case, the distance between the transistors and the snubber capacitor tends to be elongated, which may result in the failure to sufficiently reduce surge voltage.

Accordingly, one of the objects of the present disclosures is to provide a semiconductor module that is capable of reducing surge voltage more reliably.

In the following, embodiments of the technology of the present disclosures will be described with reference to the accompanying drawings. In the description of the drawings, the same elements are referred to by the same numerals, and a duplicate description will be omitted.

Description of Embodiments

In the following, embodiments of the disclosed technology will be listed and described.

A semiconductor module according to an aspect of the present disclosures is a semiconductor module including a power conversion circuit, and includes an insulating substrate, a first transistor constituting an upper arm of the power conversion circuit, a second transistor constituting a lower arm of the power conversion circuit and electrically series-coupled to the first transistor, a first input interconnection pattern disposed on the insulating substrate and coupled to a positive-side input terminal for supplying positive power to the power conversion circuit, a second input interconnection pattern disposed on the insulating substrate and coupled to a negative-side input terminal for supplying negative power (e.g., negative voltage) to the power conversion circuit, an output interconnection pattern disposed on the insulating substrate and coupled to an output terminal for outputting output power of the power conversion circuit, and an absorbing device configured to absorb surge voltage in the power conversion circuit, wherein the first input interconnection pattern includes a first-transistor mounting area on which the first transistor is mounted, wherein the output interconnection pattern includes a second-transistor mounting area on which the second transistor is mounted, wherein the second input interconnection pattern includes an absorbing-device connecting area that is disposed between the first-transistor mounting area and the second-transistor mounting area, and wherein the absorbing-device connecting area is electrically coupled to the first-transistor mounting area through the absorbing device.

In the above-noted configuration, the absorbing-device connecting area of the second input interconnection pattern coupled to the negative-side input terminal is situated between the first-transistor mounting area of the first input interconnection pattern coupled to the positive-side input terminal and the second-transistor mounting area of the output interconnection pattern coupled to the output terminal. The first-transistor mounting area has the first transistor mounted thereon that constitutes an upper arm of the power conversion circuit, and the second-transistor mounting area has the second transistor mounted thereon that constitutes a lower arm of the power conversion circuit. The first-transistor mounting area and the absorbing-device mounting area are coupled through the absorbing device. In such an arrangement and such an interconnection configuration, the absorbing device can be situated close to the first transistor and to the second transistor. As a result, the wire inductance of the current path through which current generated immediately after the turning on or turning off of each of the first transistor and the second transistor flows is lowered, which enables effective reduction of surge voltage.

The second input interconnection pattern may include a capacitor connecting area seamlessly connected to an end of the absorbing-device connecting area, and the absorbing-device connecting area and the capacitor connecting area may be disposed on the insulating substrate such as to surround the first-transistor mounting area. The capacitor connecting area may be electrically coupled to the first-transistor mounting area through a capacitor.

In this case, the capacitor connecting area of the second input interconnection pattern and the first-transistor mounting area are electrically coupled through the capacitors, so that the voltage (e.g., direct-current voltage) applied to the series-connected first transistors and second transistors can be stabilized.

According to an embodiment, the semiconductor module may further include an auxiliary pattern disposed on the insulating substrate between the absorbing-device connecting area and the first-transistor mounting area, wherein the absorbing device may include a first circuit element and a second circuit element, wherein the first circuit element may electrically couple the auxiliary interconnection pattern and the first-transistor mounting area, and wherein the second circuit element may electrically couple the auxiliary interconnection pattern and the absorbing-device connecting area.

The first circuit element and the second circuit element may be capacitors. There is a tendency for the withstanding voltage of a capacitor to lower as the capacitance increases. Provision of the first circuit element and the second circuit element to couple the first input interconnection pattern and the second input interconnection through the third auxiliary pattern secures voltage tolerance while ensuring that the absorbing device has a sufficient capacitance to reduce surge voltage. The first circuit element and the second circuit element may be such that one is a resistor and the other is a capacitor, for example. In this case, the absorbing device serves as an RC snubber element.

According to an embodiment, the semiconductor module may include a plurality of noted first transistors, and a plurality of noted second transistors, wherein the plurality of first transistors may be mounted on the first-transistor mounting area, and may electrically be coupled in parallel, and wherein the plurality of second transistors may be mounted on the second-transistor mounting area, and may electrically be coupled in parallel.

In this case, a plurality of absorbing devices may be provided, and may be disposed at spaced intervals.

The arrangement of the absorbing devices at spaced intervals enables each absorbing device to be disposed in close physical proximity to a corresponding one of the first transistors and the second transistors. This arrangement can reduce surge voltage more effectively.

A semiconductor module according to a further aspect of the present disclosures include an insulating substrate, a first transistor constituting an upper arm of a power conversion circuit, a second transistor constituting a lower arm of the power conversion circuit, a first input interconnection pattern being a flat conductive plate disposed on the insulating substrate, the first input interconnection pattern having the first transistor mounted thereon and being electrically coupled to a first end of the first transistor, an output interconnection pattern being a flat conductive plate disposed on the insulating substrate, the output interconnection pattern having the second transistor mounted thereon and being electrically coupled to a first end of the second transistor, a second input interconnection pattern disposed on the insulating substrate and arranged at a position between the first input interconnection pattern and the output interconnection pattern, an interconnection electrically coupling a second end of the first transistor and the output interconnection pattern to each other, an interconnection electrically coupling a second end of the second transistor and the second input interconnection pattern to each other, and a capacitive device connected between the first input interconnection pattern and the second input interconnection pattern.

In the above configuration, the second input interconnection pattern is situated at a position between the first input interconnection pattern having the first transistor mounted thereon and the output interconnection pattern having the second transistor mounted thereon, with the capacitive device being connected between the first input interconnection pattern and the second input interconnection pattern. This configuration enables the capacitive device to be situated close to the first transistor and to the second transistor. As a result, the wire inductance of a respective current path between the absorbing device and each of the first transistor and the second transistor is lowered, which serves to reduce surge voltage efficiently.

Details of Embodiments

In the following, specific examples of the embodiments of the disclosed technology will be described with reference to the drawings. The present invention is not limited to those examples, and is intended to be defined by the scope of the claims and to include any variations and modifications falling within the scope warranted for equivalents of the scope of the claims. In the description of the drawings, the same elements are referred to by the same numerals, and a duplicate description will be omitted.

Figure 2:
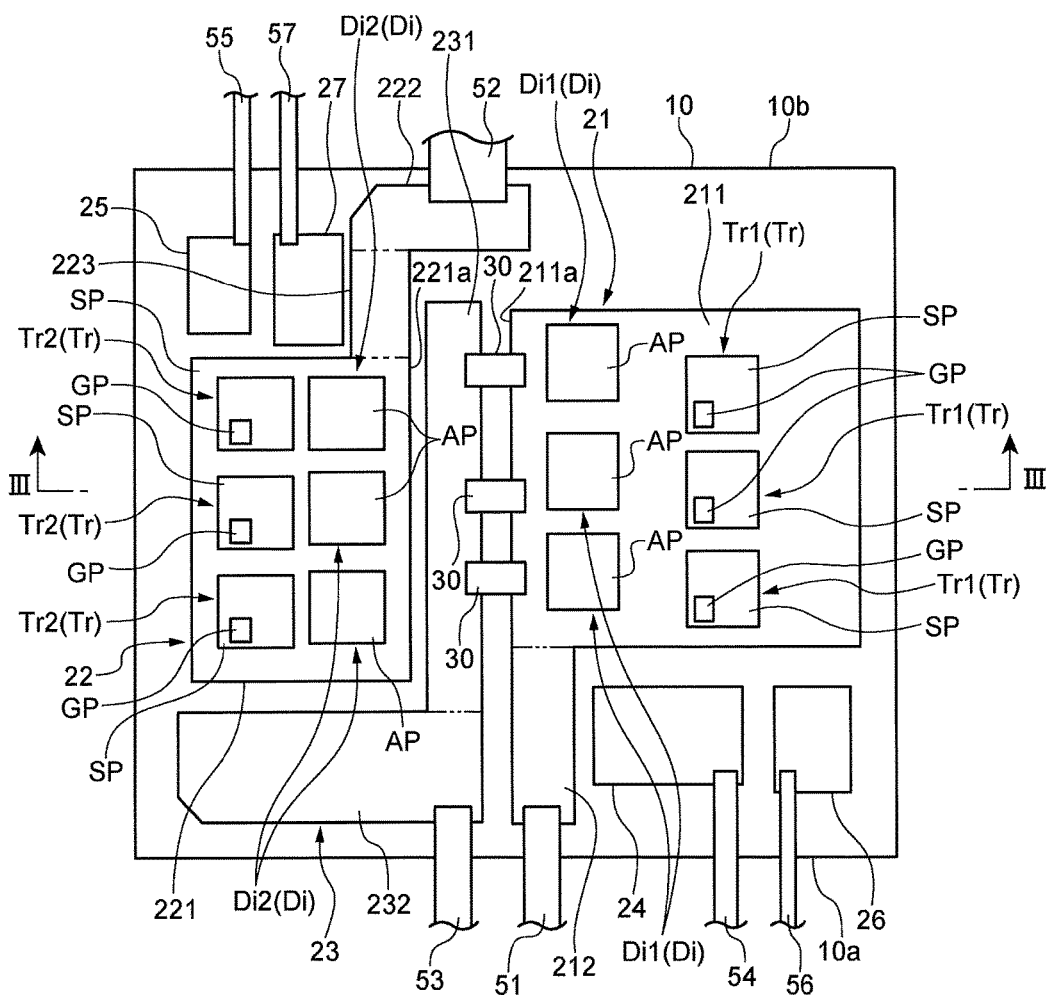
FIG. 2 is a schematic diagram of a configuration on an insulating substrate of the semiconductor module illustrated in FIG. 1.

A semiconductor module 1 schematically illustrated in FIG. 1 and FIG. 2 serves as a power conversion apparatus such as an inverter device. The semiconductor module 1 includes a plurality of transistors Tr, an insulating substrate 10, a P pad (i.e., first input interconnection pattern) 21, an O pad (i.e., output interconnection pattern) 22, an N pad (i.e., second input interconnection pattern) 23, and a plurality of surge voltage absorbing devices 30 (which will hereinafter be referred to simply as "absorbing devices").

The semiconductor module 1 may include a first control pad 24 and a second control pad 25. The semiconductor module 1 may include a first auxiliary pad 26 and a second auxiliary pad 27. The semiconductor module 1 may include a plurality of diodes Di. Further, the semiconductor module 1 may include a case 40 for storing the insulating substrate 10 as well as the transistors Tr and interconnection structures therebetween mounted on the insulating substrate 10. In FIG. 1, the case 40 is schematically illustrated in dashed lines. The case 40 is made of a resin, for example. The structure (i.e., pads such as the P pad 21 and the O pad 22, the transistors Tr, and wires or the like for interconnections therebetween) on the insulating substrate 10 stored in the case 40 is embedded in silicone gel, for example.

In the following, unless otherwise indicated, a description will be given of the embodiment in which the semiconductor module 1 includes the first control pad 24, the second control pad 25, the first auxiliary pad 26, the second auxiliary pad 27, the diodes Di, and the case 40. In the descriptions, two directions perpendicular to the thickness direction of the insulating substrate 10 may sometimes be referred to as the X direction and the Y direction, as illustrated in FIG. 1. The X direction and the Y direction are perpendicular to each other.

Figure 3:
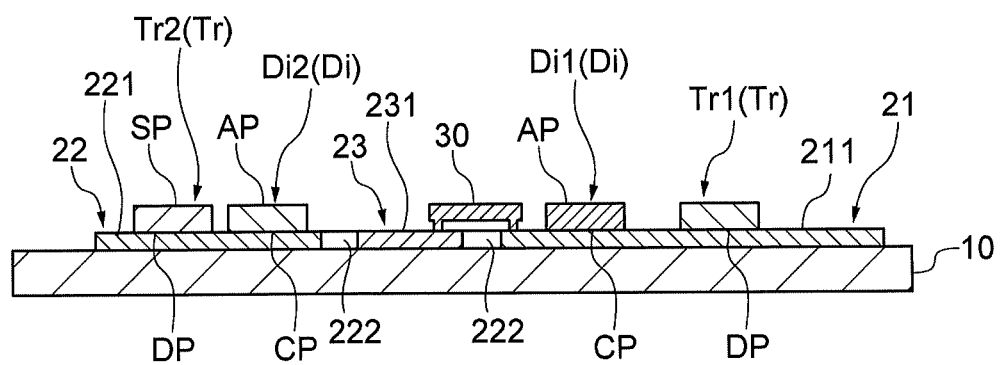
FIG. 3 is a schematic diagram of a cross-sectional configuration along the line in FIG. 1.

The plurality of transistors Tr are mounted on the insulating substrate 10. The transistors tr, which are vertical transistors, include a first upper electrode SP, a second upper electrode GP, and a lower electrode DP (see FIG. 3) as illustrated in FIG. 1, FIG. 2, and FIG. 3. In FIG. 3, graphic illustration is omitted with respect to an O terminal 52, a second control terminal 55, and a second auxiliary terminal 57, which will be described later. The first upper electrode SP and the lower electrode DP are the first main electrode and the second main electrode, respectively, for supplying voltage to the transistors Tr. The second upper electrode GP is the control electrode for supplying a control signal (or a control voltage) to the transistors Tr. The conductive state of each transistor Tr between the first upper electrode SP and the lower electrode DP is controlled in response to the control signal applied to the second upper electrode GP. With this arrangement, the transistors Tr serve as switching elements. The transistors Tr may alternatively be lateral transistors.

Examples of the material of the transistors Tr include Si and wide-bandgap semiconductors such as SiC and GaN. Examples of the transistors Tr include a MOSFET (i.e., metal-oxide-semiconductor field-effect transistor) and an insulated-gate bipolar transistor (i.e., IGBT).

In the case of the transistors Tr being MOSFETs, the first upper electrode SP, the second upper electrode GP, and the lower electrode DP correspond to the source electrode, the gate electrode, and the drain electrode, respectively. In the case of the transistors Tr being IGBTs, the first upper electrode SP, the second upper electrode GP, and the lower electrode DP correspond to the emitter electrode, the gate electrode, and the collector electrode, respectively. In the following, the transistors Tr are MOSFETs, unless otherwise indicated.

The plurality of transistors Tr are electrically coupled to form a power conversion circuit 2. In the present embodiment, the power conversion circuit 2 is a single-phase inverter circuit. In this case, the semiconductor module 1 is a 2-in-1-type semiconductor module, for example. Among the plurality of transistors Tr, the transistors Tr constituting the upper arm of the power conversion circuit 2 are referred to as first transistors Tr1, and the transistors Tr constituting the lower arm are referred to as second transistors Tr2. The present embodiment is directed to an example in which the semiconductor module 1 has three first transistors Tr1 and three second transistors Tr2. However, the number of first transistors Tr1 and the number of second transistors Tr2 are not limited to three.

The plurality of diodes Di, which are mounted on the insulating substrate 10, serve as freewheeling diodes in the power conversion circuit 2. The plurality of diodes Di include first diodes Di1 corresponding to the first transistors Tr1 and second diodes Di2 corresponding to the second transistors Tr2. The number of first diodes Di1 may be equal to the number of first transistors Tr1, for example. Similarly, the number of second diodes Di2 may be equal to the number of second transistors Tr2.

The insulating substrate 10 is a ceramic substrate, for example. Examples of the material of the insulating substrate 10 include AlN, SiN, and $Al_2O_3$. The insulating substrate 10 as viewed in the thickness direction is not limited to a particular shape. Examples of the shape of the insulating substrate 10 include a rectangle and a square. The back face of the insulating substrate 10 (which is opposite the face on which the first transistors Tr1 and the second transistors Tr2 are mounted) may have a heat sink layer formed thereon made of copper or the like.

In the following, the configuration on the insulating substrate 10 will be described by mainly referring to FIG. 2.

The P pad 21, which is mounted on the insulating substrate 10 as illustrated in FIG. 2, is an electrode pattern (or interconnection pattern) for supplying positive power (e.g., positive voltage) to the power conversion circuit 2. An example of the material of the P pad 21 is copper. The P pad 21 includes a first area (first transistor mounting area) 211 and a second area 212. In FIG. 2, the boundary between the first area 211 and the second area 212 is shown by a dash-and-two-dot line for illustrative purposes. This also applies to other drawings (e.g., FIG. 1).

The first area 211 of the P pad 21 is the area on which the plurality of first transistors Tr1 and the first diodes Di1 provided in one-to-one correspondence with the first transistors Tr1 are mounted. It suffices for the first area 211 to have an area of sufficient size for mounting the plurality of first transistors Tr1 and the plurality of first diodes Di1. The first area 211 is not limited to a particular shape, and may be a quadrilateral such as a rectangle or a square.

Each first transistor Tr1 is mounted on the first area 211 such that the lower electrode DP and the first area 211 face each other, and are electrically coupled to each other. Each first diode Di1 is mounted on the first area 211 such that the cathode CP and the first area 211 face each other, and are electrically coupled to each other. The lower electrode DP and the cathode CP may be fixedly mounted to the first area 211 through solder or sintered material, for example.

The arrangement of the first transistors Tr1 and the first diodes Di1 on the first area 211 is not limited to a particular arrangement. For example, the plurality of first transistors Tr1 may be aligned in the Y direction as illustrated in FIG. 2, and the first diodes Di1 may be disposed alongside the respective first transistors Tr1 on the side toward the O pad 22.

The second area 212 of the P pad 21 is the area to which a P terminal (i.e., positive-side input terminal) 51 for supplying positive power to the semiconductor module 1 is coupled. One end of the P terminal 51 may be fixedly mounted to the second area 212 through solder or sintered material, for example. The other end of the P terminal 51, which is situated outside the case 40, is coupled to an external apparatus (or external circuit). Accordingly, the second area 212 is coupled to the external apparatus (or external circuit) through the P terminal 51, thereby serving as an outside connecting area.

It suffices for the second area 212 to have an area of sufficient size for the P terminal 51 to be connected. The second area 212 is seamlessly connected to the first area 211. The second area 212 may be formed near an edge of the insulating substrate 10. FIG. 2 illustrates an example in which the second area 212 is formed near an edge 10*a* of the insulating substrate 10.

The O pad 22 is an electrode pattern (or interconnection pattern) for outputting the output power (e.g., alternating voltage) of the power conversion circuit 2. An example of the material of the O pad 22 is copper. The O pad 22 includes a first area (second transistor mounting area) 221, a second area 222, and a middle area 223. In FIG. 2, the boundary between the first area 221 and the middle area 223 and the boundary between the middle area 223 and the second area 222 are shown by dash-and-two-dot lines for illustrative purposes. This also applies to other drawings (e.g., FIG. 1).

The first area 221 of the O pad 22 is the area on which the plurality of second transistors Tr2 and the second diodes Di2 provided in one-to-one correspondence with the second transistors Tr2 are mounted. It suffices for the first area 221 to have an area of sufficient size for mounting the plurality of second transistors Tr2 and the plurality of second diodes Di2 and for mounting interconnections in the case of interconnections (wirings) being provided by utilizing the first area 221 as will be described later. The first area 221 is not limited to a particular shape, and may be a quadrilateral such as a rectangle or a square. The first area 221 is disposed at a spaced distance from the first area 211 of the P pad 21 in a predetermined direction (i.e., in the X direction in FIG. 2).

Each second transistor Tr2 is mounted on the first area 221 such that the lower electrode DP and the first area 221 face each other, and are electrically coupled to each other. Each second diode Di2 is mounted on the first area 221 such that the cathode CP and the first area 221 face each other, and are electrically coupled to each other. The lower electrode DP and the cathode CP may be fixedly mounted to the first area 221 through solder or sintered material, for example.

The arrangement of the second transistors Tr2 and the second diodes Di2 on the first area 221 is not limited to a particular arrangement. For example, the plurality of second transistors Tr2 may be aligned in the Y direction as illustrated in FIG. 2, and the second diodes Di2 may be disposed alongside the respective second transistors Tr2 on the side toward the P pad 21.

The second area 222 of the O pad 22 is the area to which the O terminal (i.e., output terminal) 52 for outputting the output power of the power conversion circuit 2 is coupled. One end of the O terminal 52 may be fixedly mounted to the second area 222 through solder or sintered material, for example. The other end of the O terminal 52, which is situated outside the case 40, is coupled to an external apparatus (or external circuit). Accordingly, the second area 222 is coupled to the external apparatus (or external circuit) through the O terminal 52, thereby serving as an outside connecting area. It suffices for the second area 222 to have an area of sufficient size for the O terminal 52 to be connected. The second area 222 may generally be formed near an edge of the insulating substrate 10. FIG. 2 illustrates an example in which the second area 222 is formed near an edge 10*b* of the insulating substrate 10 opposite the edge 10*a*.

The middle area 223 is the area which connects the first area 221 and the second area 222. The middle area 223 is seamlessly connected to the first area 221 and the second area 222. The middle area 223 may be part of the first area 221 or the second area 222.

The N pad 23 is an electrode pattern (or interconnection pattern) for supplying negative power (e.g., negative voltage) to the power conversion circuit 2. An example of the material of the N pad 23 is copper. The N pad 23 includes a first area (absorbing device coupling area) 231 and a second area 232. In FIG. 2, the boundary between the first area 231 and the second area 232 is shown by a dash-and-two-dot line for illustrative purposes. This also applies to other drawings (e.g., FIG. 1).

The first area 231, which is part of the N pad 23, is disposed at a spaced distance from the P pad 21 and the O pad 22, between the first area 211 of the P pad 21 and the first area 221 of the O pad 22, in a plane defined by the upper face of the insulating substrate 10 (i.e., in a plan view as viewed in the thickness direction of the insulating substrate 10). The first area 231 of the N pad 23, which is situated opposite the first area 211 of the P pad 21 and opposite the first area 221 of the O pad 22, extends in a direction intersecting the direction (i.e., the X direction in FIG. 2) in which the first area 211 and the first area 221 are aligned. In FIG. 2, the first area 231 of the N pad 23 extends along an edge 211*a* of the first area 211 of the P pad 21 (or along an edge 221*a* of the first area 221 of the O pad 22).

The second area 232 of the N pad 23 is the area to which an N terminal (i.e., negative-side input terminal) 53 for supplying negative power to the power conversion circuit 2 is coupled. One end of the N terminal 53 may be fixedly mounted to the second area 232 through solder or sintered material, for example. The other end of the N terminal 53, which is situated outside the case 40, is coupled to an external apparatus (or external circuit). Accordingly, the second area 232 is coupled to the external apparatus (or external circuit) through the N terminal 53, thereby serving as an outside connecting area. It suffices for the second area 232 to have an area of sufficient size for the N terminal 53 to be connected. The second area 232, which is seamless with the first area 231, is disposed near an edge of the insulating substrate 10, for example. FIG. 2 illustrates an example in which the second area 232 is disposed near the edge 10*a* of the insulating substrate 10.

The first control pad 24 is an electrode pattern (or interconnection pattern) to which a first control terminal 54 for supplying a control signal (i.e., gate signal or gate voltage) to the second upper electrodes GP of the first transistors Tr1 is connected to, thereby serving as a gate pad. An example of the material of the first control pad 24 is copper. One end of the first control terminal 54 may be fixedly mounted to the first control pad 24 through solder or sintered material, for example. The other end of the first control terminal 54, which is situated outside the case 40, is coupled to an external apparatus (or external circuit). Accordingly, the first control pad 24 is electrically coupled to the external apparatus (or external circuit) through the first control terminal 54. It suffices for the first control pad 24 to have an area of sufficient size for the first control terminal 54 to be connected and also for interconnections (i.e., wirings) to be provided, which will be described later. It suffices for the first control pad 24 to be disposed on the insulating substrate 10 such that interconnections to the second upper electrodes GP of the first transistors Tr1 are easily made. FIG. 2 illustrates an example in which the first control pad 24 is disposed near the edge 10a of the insulating substrate 10.

The second control pad 25 is an electrode pattern (or interconnection pattern) to which a second control terminal 55 for supplying a control signal (i.e., gate signal or gate voltage) to the second upper electrodes GP of the second transistors Tr2 is connected to, thereby serving as a gate pad. An example of the material of the second control pad 25 is copper. One end of the second control terminal 55 may be fixedly mounted to the second control pad 25 through solder or sintered material, for example. The other end of the second control terminal 55, which is situated outside the case 40, is coupled to an external apparatus (or external circuit). Accordingly, the second control pad 25 is electrically coupled to the external apparatus (or external circuit) through the second control terminal 55. It suffices for the second control pad 25 to have an area of sufficient size for the second control terminal 55 to be connected and also for interconnections (i.e., wirings) to be provided, which will be described later. It suffices for the second control pad 25 to be disposed on the insulating substrate 10 such that interconnections to the second upper electrodes GP of the second transistors Tr2 are easily made. FIG. 2 illustrates an example in which the second control pad 25 is disposed near the edge 10b of the insulating substrate 10.

The first auxiliary pad 26 is an electrode pattern (or interconnection pattern) to which a first auxiliary terminal 56 for outputting the potential of the first upper electrodes SP of the first transistors Tr1 is connected. An example of the material of the first auxiliary pad 26 is copper. One end of the first auxiliary terminal 56 may be fixedly mounted to the first auxiliary pad 26 through solder or sintered material, for example. The other end of the first auxiliary terminal 56, which is situated outside the case 40, is coupled to an external apparatus (or external circuit). Accordingly, the first auxiliary pad 26 is electrically coupled to the external apparatus (or external circuit) through the first auxiliary terminal 56. In the case of the first upper electrode SP being a source electrode, the first auxiliary pad 26 serves as an upper-arm-side source pad of the semiconductor module 1. The potential of the first upper electrodes SP output from the first auxiliary terminal 56 is utilized to generate a control signal that is supplied to the second upper electrodes GP of the first transistors Tr1, for example. It suffices for the first auxiliary pad 26 to be disposed on the insulating substrate 10 such that interconnections to the first upper electrodes SP of the first transistors Tr1 are easily made. FIG. 2 illustrates an example in which the first auxiliary pad 26 is disposed near the edge 10a of the insulating substrate 10. It suffices for the first auxiliary pad 26 to have an area of sufficient size for the first auxiliary terminal 56 to be connected and also for interconnections (i.e., wirings) to be provided, which will be described later.

The second auxiliary pad 27 is an electrode pattern (or interconnection pattern) to which the second auxiliary terminal 57 for outputting the potential of the first upper electrodes SP of the second transistors Tr2 is connected. An example of the material of the second auxiliary pad 27 is copper. One end of the second auxiliary terminal 57 may be fixedly mounted to the second auxiliary pad 27 through solder or sintered material, for example. The other end of the second auxiliary terminal 57, which is situated outside the case 40, is coupled to an external apparatus (or external circuit). Accordingly, the second auxiliary pad 27 is electrically coupled to the external apparatus (or external circuit) through the second auxiliary terminal 57. In the case of the upper electrode SP being a source electrode, the second auxiliary pad 27 serves as a lower-arm-side source pad of the semiconductor module 1. The potential of the first upper electrodes SP output from the second auxiliary terminal 57 is utilized to generate a control signal that is supplied to the second upper electrodes GP of the second transistors Tr2, for example. It suffices for the second auxiliary pad 27 to be disposed on the insulating substrate 10 such that interconnections to the first upper electrodes SP (i.e., source electrodes) of the second transistors Tr2 are easily made. FIG. 2 illustrates an example in which the second auxiliary pad 27 is disposed near the edge 10b of the insulating substrate 10. It suffices for the second auxiliary pad 27 to have an area of sufficient size for the second auxiliary terminal 57 to be connected and also for interconnections (i.e., wirings) to be provided, which will be described later.

The plurality of absorbing devices 30 are the devices which absorb a surge voltage in the power conversion circuit 2. An example of the absorbing devices 30 is a capacitor. An example of the capacitor is a ceramic capacitor. It suffices for the capacitor for surge absorbing purposes to have a sufficient capacitance for absorbing an expected surge voltage. The absorbing devices 30 are connected to the first area 211 of the P pad 21 at one end thereof, and are connected to the first area 231 of the N pad 23 at the other end thereof. The plurality of absorbing devices 30 are disposed at spaced intervals along the direction in which the first area 231 extends. The number of absorbing devices 30 may be equal to a number obtained by dividing the total capacitance required to absorb a surge voltage by the capacitance of a single capacitor taking into account derating.

The P terminal 51, the O terminal 52, the N terminal 53, the first control terminal 54, the second control terminal 55, the first auxiliary terminal 56, and the second auxiliary terminal 57 may be the constituent elements of the semiconductor module 1 when the semiconductor module 1 is implemented as a configuration having the case 40.

Figure 9:
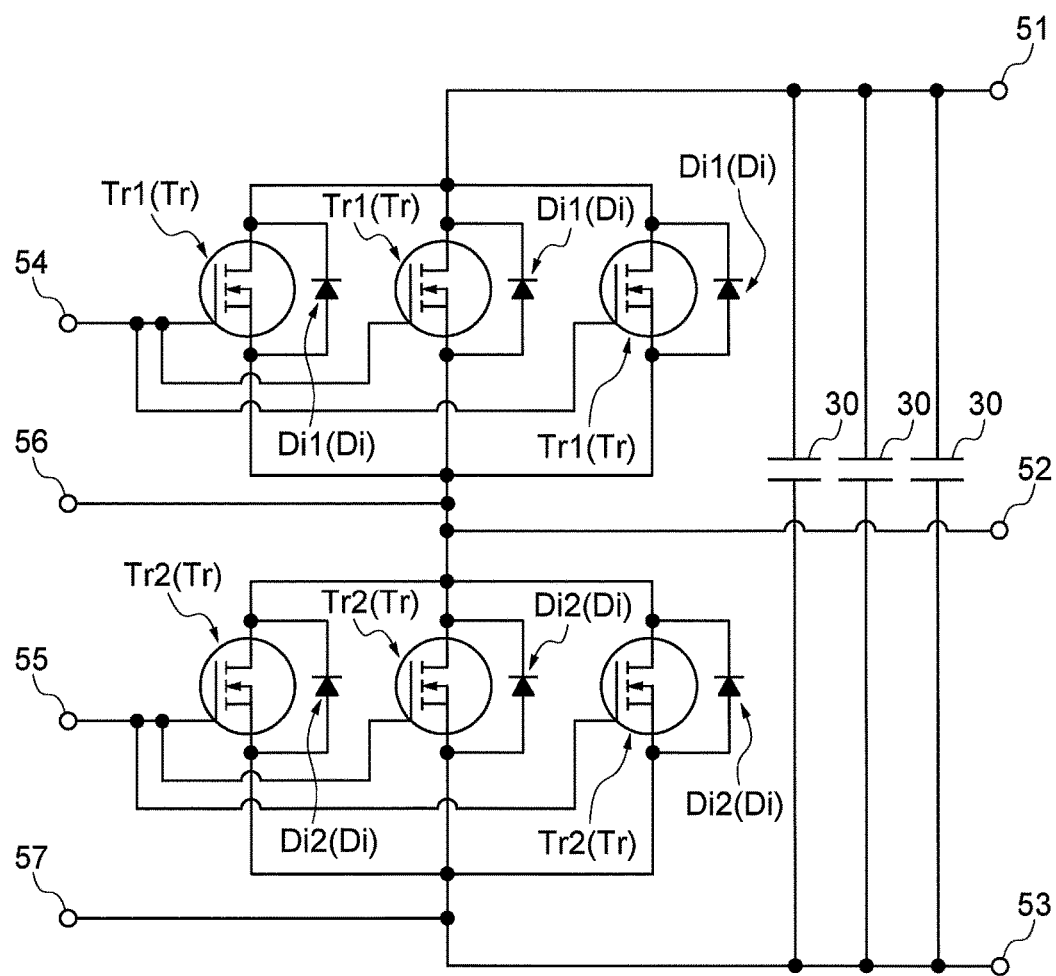
FIG. 9 is a drawing illustrating an equivalent circuit of the semiconductor module illustrated in FIG. 1.

In the following, electrical connections including interconnection structures in the semiconductor module 1 will be described by referring to FIG. 1 and FIG. 9. FIG. 9 is a drawing illustrating an equivalent circuit of the semiconductor module 1. In FIG. 9, those elements corresponding to the constituent elements of the semiconductor module 1 are referred to by the same or similar reference characters. In FIG. 9, the absorbing devices 30 are illustrated as capacitors. The semiconductor module 1 has interconnections placed therein such as to implement the equivalent circuit illustrated in FIG. 9.

The lower electrodes DP of the first transistors Tr1 and the cathodes CP of the first diodes Di1 are electrically coupled to each other through the P pad 21, and the P pad 21 is connected to the P terminal 51. Accordingly, the lower electrodes DP of the first transistors Tr1 and the cathodes CP of the first diodes Di1 are electrically coupled to the P terminal 51. Further, the first upper electrodes SP of the first transistors Tr1 are coupled through wires W1 to the respective anodes AP of the first diodes Di1. In this manner, the first transistors Tr1 and the first diodes Di1 are coupled in reverse parallel, with the first diodes Di1 serving as freewheeling diodes. Examples of the wires W1 include wires, ribbons, etc. Examples of the material of the wires W1 include copper, aluminum, etc. The number of wires W1 may be one, or may be more than one.

The second upper electrode GP of the first transistors Tr1 are coupled to the first control pad 24 through wires W2. Examples of the wires W2 include wires, ribbons, etc. Examples of the material of the wires W2 include copper, aluminum, etc. Due to the fact that the first control terminal 54 is coupled to the first control pad 24, the second upper electrodes GP of the first transistors Tr1 are electrically coupled to the first control terminal 54. A control signal can thus be applied through the first control terminal 54 to the second upper electrodes GP of the first transistors Tr1.

The first upper electrodes SP of the first transistors Tr1 are also coupled to the first auxiliary pad 26 through wires W3. Examples of the wires W3 include wires, ribbons, etc. Examples of the material of the wires W3 include copper, aluminum, etc. Due to the fact that the first auxiliary terminal 56 is coupled to the first auxiliary pad 26, the first upper electrodes SP of the first transistors Tr1 are electrically coupled to the first auxiliary terminal 56. Accordingly, the potential of the first upper electrodes SP of the first transistors Tr1 can be output through the first auxiliary terminal 56, and the output potential can be utilized to generate a control signal for controlling the first transistors Tr1.

The anodes AP of the first diodes Di1 are coupled to the O pad 22 through wires W4. Accordingly, the first upper electrodes SP of the first transistors Tr1 are coupled to the O pad 22 through the anodes AP of the first diodes Di1 and the wires W4. The plurality of first transistors Tr1 are thus electrically coupled in parallel. In the configuration illustrated in FIG. 1, the wires W4 are coupled at one end thereof to an area of the O pad 22 that is not the second area 222, for example. Examples of the wires W4 include wires, ribbons, etc. Examples of the material of the wires W4 include copper, aluminum, etc. The number of wires W4 may be one, or may be more than one.

The lower electrodes DP of the second transistors Tr2 and the cathodes CP of the second diodes Di2 are electrically coupled to each other through the O pad 22, and the O pad 22 is connected to the O terminal 52. Accordingly, the lower electrodes DP of the second transistors Tr2 and the cathodes CP of the second diodes Di2 are electrically coupled to the O terminal 52. Further, the first upper electrodes SP of the second transistors Tr2 are coupled through wires W5 to the respective anodes AP of the second diodes Di2. In this manner, the second transistors Tr2 and the second diodes Di2 are coupled in reverse parallel, with the second diodes Di2 serving as freewheeling diodes. Examples of the wires W5 include wires, ribbons, etc. Examples of the material of the wires W5 include copper, aluminum, etc. The number of wires W5 may be one, or may be more than one.

The second upper electrode GP of the second transistors Tr2 are coupled to the second control pad 25 through wires W6. Examples of the wires W6 include wires, ribbons, etc. Examples of the material of the wires W6 include copper, aluminum, etc. Due to the fact that the second control terminal 55 is coupled to the second control pad 25, the second upper electrodes GP of the second transistors Tr2 are electrically coupled to the second control terminal 55. A control signal can thus be applied through the second control terminal 55 to the second upper electrodes GP of the second transistors Tr2.

The first upper electrodes SP of the second transistors Tr2 are also coupled to the second auxiliary pad 27 through wires W7. Examples of the wires W7 include wires, ribbons, etc. Examples of the material of the wires W7 include copper, aluminum, etc. Due to the fact that the second auxiliary terminal 57 is coupled to the second auxiliary pad 27, the first upper electrodes SP of the second transistors Tr2 are electrically coupled to the second auxiliary terminal 57. Accordingly, the potential of the first upper electrodes SP of the second transistors Tr2 can be output through the second auxiliary terminal 57, and the output potential can be utilized to generate a control signal for controlling the second transistors Tr2.

The anodes AP of the second diodes Di2 are coupled to the N pad 23 through wires W8. Examples of the wires W8 include wires, ribbons, etc. Examples of the material of the wires W8 include copper, aluminum, etc. The number of wires W8 may be one, or may be more than one. The wires W8 are preferably arranged in parallel to the wires W4 in order to reduce parasitic inductance between the P pad 21 and the N pad 23 (namely, between the P terminal 51 and the N terminal 53) due to the effect of mutual inductance. In the example illustrated in FIG. 1, the anodes AP of the second diodes Di2 are coupled to the first area 231 of the N pad 23 through the wires W8. Accordingly, the first upper electrodes SP of the second transistors Tr2 are coupled to the N pad 23 through the anodes AP of the second diodes Di2 and the wires W8. The plurality of second transistors Tr2 are thus electrically coupled in parallel.

In the interconnection structure described above, the first upper electrodes SP of the first transistors coupled in parallel are electrically coupled to the O pad 22, and the lower electrodes DP of the second transistors Tr2 coupled in parallel are electrically coupled to the O pad 22. Accordingly, the first upper electrodes SP of the first transistors Tr1 coupled in parallel are electrically coupled to the lower electrodes DP of the second transistors Tr2 coupled in parallel. Further, the lower electrodes DP of the first transistors Tr1 coupled in parallel are electrically coupled to the P terminal 51, and the first upper electrodes SP of the second transistors Tr2 coupled in parallel are electrically coupled to the N terminal 53. Accordingly, as illustrated in FIG. 9, the group of first transistors Tr1 coupled in parallel and the group of second transistors Tr2 coupled in parallel are connected in series between the P terminal 51 and the N terminal 53. In this manner, the configuration on the insulating substrate 10 constitutes the power conversion circuit 2.

The absorbing devices 30 provide couplings between the first area 211 of the P pad 21 and the first area 231 of the N pad 23, which is situated between the first area 211 of the P pad 21 and the first area 221 of the O pad 22. Further, the second transistors Tr2 and the first area 231 having the absorbing devices 30 mounted thereon are electrically coupled to each other through the wires W8, the wires W5, and the second diodes Di2 mounted on the first area 221 of the O pad 22. With this arrangement, the absorbing devices 30 are electrically coupled in parallel to the group of first transistors Tr1 constituting the upper arm and the group of second transistors Tr2 constituting the lower arm which are electrically coupled in series between the P terminal 51 and the N terminal 53 of the power conversion circuit 2.

In the configuration of the semiconductor module 1, control signals are applied to the first transistors Tr1 and the second transistors Tr2 through the first control terminal 54 and the second control terminal 55, respectively, thereby alternately turning on and off the first transistors Tr1 and the second transistors Tr2. In this manner, the direct-current power (e.g., direct-current voltage) applied between the P terminal 51 and the N terminal 53 is converted into alternate-current power (e.g., alternate-current voltage), which may be output through the O terminal 52.

In the power conversion circuit 2 including the first transistors Tr1 and the second transistors Tr2 connected in series between the P terminal 51 and the N terminal 53, surge voltage occurs when each of the first transistors Tr1 and the second transistors Tr2 is turned on or off.

The size of surge voltage is calculated by L·di/dt when the current is denoted as i, and the inductance is denoted as L. The inductance that controls the size of surge voltage includes the wire inductance of the path through which the current i flows. Further, di/dt depends on the speed of switching of the first transistors Tr1 and the second transistors Tr2. As continuing efforts have been made to increase the speed of switching, there is a tendency for di/dt to increase. Especially when a wide-bandgap semiconductor is used as the material for the first transistors Tr1 and the second transistors Tr2, di/dt tends to increase because the switching speed is faster than in the case of Si. In order to effectively reduce surge voltage, therefore, it is important to reduce wire inductance included in the inductance L by placing the absorbing devices 30 in close physical proximity (in terms of the length of electrical connections) to the first transistors Tr1 and to the second transistors Tr2.

In the semiconductor module 1, the N pad 23 has the first area 231 which is situated between the first area 211 of the P pad 21 and the first area 221 of the O pad 22. The absorbing devices 30 are connected to the first area 231 of the N pad 23 and to the first area 211 of the P pad 21. Further, the second transistors Tr2 and the first area 231 of the N pad 23 are electrically coupled to each other through the wires W8, the wires W5, and the second diodes Dig mounted on the first area 221 of the O pad 22.

In this configuration, the absorbing devices 30 are placed in close physical proximity (in terms of the length of electrical connections) to the first transistors Tr1 and the second transistors Tr2 performing switching operations. As a result, the path of current flowing through a loop comprised of the first transistors Tr1, the second transistors Tr2, and the absorbing devices 30 has a small wire inductance when each of the first transistors Tr1 and the second transistors Tr2 is turned on or off. Because of this, surge voltage is reduced, which stabilizes the electric power (e.g., direct-current voltage) applied to the lower electrodes DP of the first transistors Tr1 and the first upper electrodes SP of the second transistors Tr2 in the series circuit comprised of the first transistors Tr1 and the second transistors Tr2.

In the semiconductor module 1, the group of first transistors Tr1 coupled in parallel and the group of second transistors Tr2 coupled in parallel are connected in series. This arrangement enables a large current to flow in the semiconductor module.

The semiconductor module 1 includes the plurality of first transistors Tr1 and the plurality of second transistors Tr2. Accordingly, the first area 211 having the first transistors Tr1 mounted thereon and the first area 221 having the second transistors Tr2 mounted thereon are larger than the area required to mount a single first transistor Tr1 or a single second transistor Tr2, for example.

Even when the first transistors Tr1 and the second transistors Tr2 are disposed at spaced intervals in the first area 211 and the first area 221, respectively, having a larger area as described above, the configuration of the semiconductor module 1 ensures that the wire inductances of the current paths from the first transistors Tr1 and the second transistors Tr2 to the absorbing devices 30 are low. This arrangement may effectively reduce surge voltage.

Moreover, the plurality of absorbing devices 30 are disposed at spaced intervals (or in a dispersed manner), so that each of the first transistors Tr1 and the second transistors Tr2 has at least one absorbing device 30, among the absorbing devices 30, situated in its close proximity. This results in the wire inductance being low with respect to the current path extending from such an absorbing device 30 to the corresponding one of the first transistors Tr1 and the second transistors Tr2, thereby reducing surge voltage more effectively. When the first area 211 of the P pad 21 and the first area 221 of the O pad 22 have a large area for mounting the plurality of first transistors Tr1 and the plurality of second transistors Tr2, respectively, the plurality of absorbing devices 30 disposed at spaced intervals can absorb surge voltage in a distributed manner, thereby enabling further reduction of surge voltage.

<First Variation>

Figure 4:
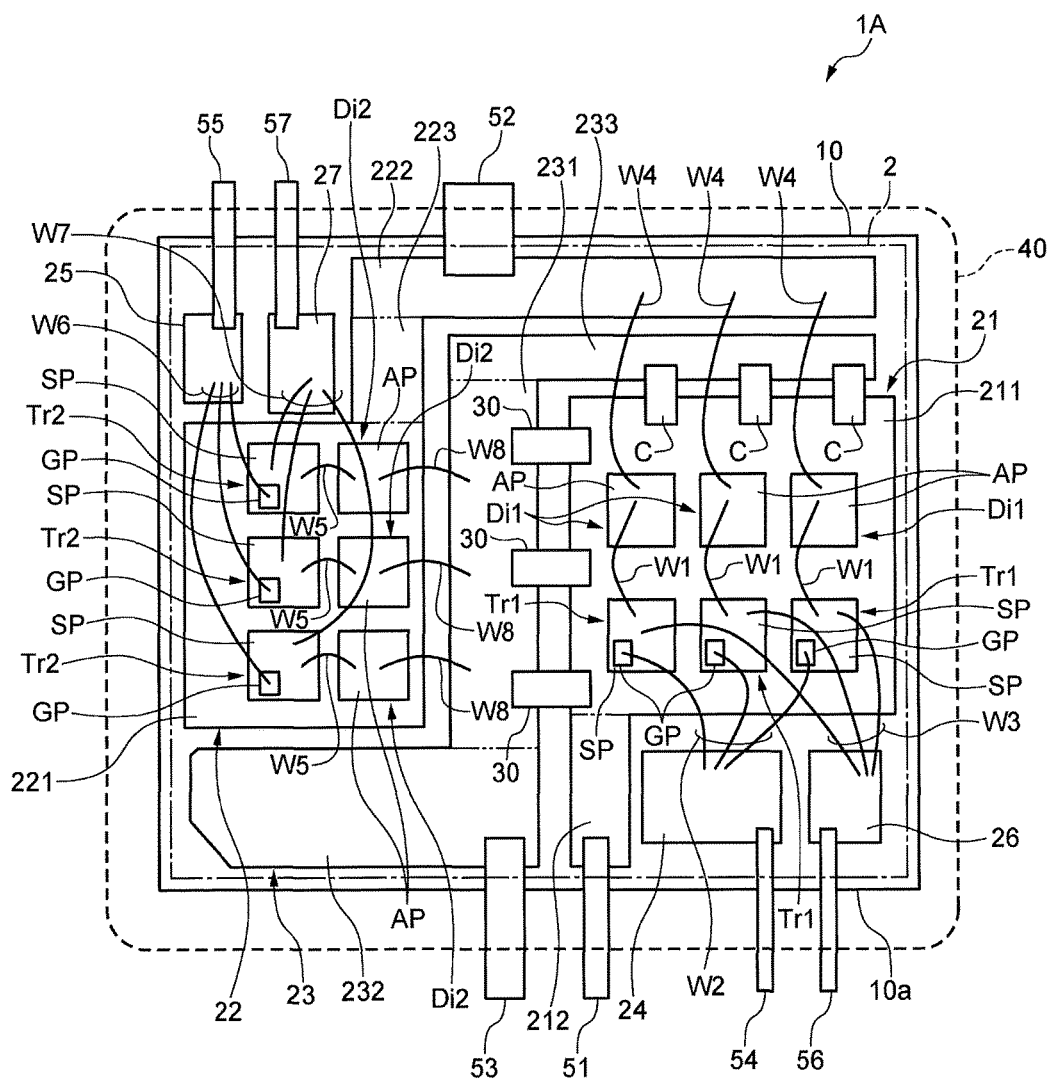
FIG. 4 is a plan view illustrating a schematic configuration of another example of the semiconductor module.
Figure 4:
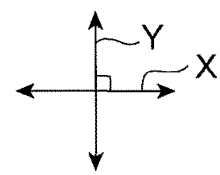
Figure 5:
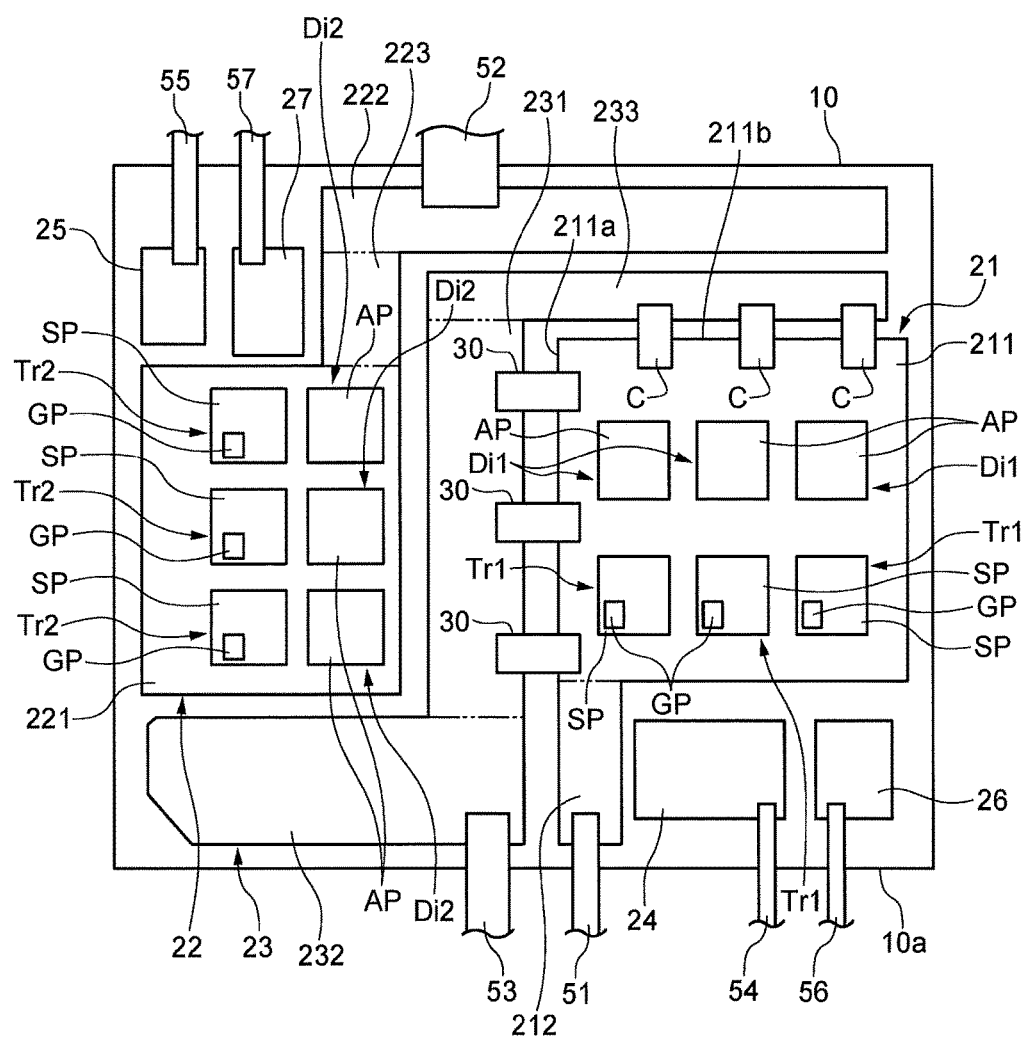
FIG. 5 is a schematic diagram of a configuration on an insulating substrate of the semiconductor module illustrated in FIG. 4.
Figure 5:
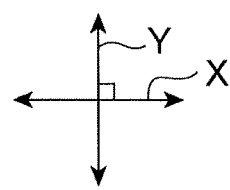

FIG. 4 is a schematic diagram of a semiconductor module 1A according to a first variation. FIG. 5 is a drawing schematically illustrating the configuration of the semiconductor module 1A on the insulating substrate 10 illustrated in FIG. 4. In FIG. 5, the wires W1 through W8 are omitted from the illustration. The semiconductor module 1A differs from the configuration of the semiconductor module 1 mainly in that the N pad 23 has a third area 233. The semiconductor module 1A will be described, with a focus on this difference.

As illustrated in FIG. 5, the third area 233 of the N pad 23 is connected to an end of the first area 231 on the side opposite the second area 232, and is seamlessly connected with the first area 231. The area of the N pad 23 constituted by the first area 231 and the third area 233 surrounds the first area 211 of the P pad 21. As illustrated as an example in FIG. 5, when the first area 211 is a rectangular shape, the third area 233 is arranged in parallel to an edge 211b of the first area 211 of the P pad 21, and the area constituted by the first area 231 and the third area 233 is a letter-L shape.

The third area 233 of the N pad 23 is coupled through the capacitors C to the first area 211 of the P pad 21 having the first transistors Tr1 mounted thereon. The third area 233 serves as a capacitor connecting area. An example of the capacitors C is a ceramic capacitor. It suffices for the number of capacitors C to be one or more.

As illustrated in FIG. 5, the configuration in which the N pad 23 has the third area 233 may have the second area 222 of the O pad 22 extending along the third area 233. Namely, the second area 222 may be formed such as to have a portion overlapping the third area 233 of the N pad 23 and the first area 211 of the P pad 21 when viewed in the view direction parallel to the Y direction.

In the semiconductor module 1A, the plurality of first transistors Tr1 are aligned at spaced intervals in the X direction as illustrated in FIG. 5. Due to the fact that the first control pad 24 and the first auxiliary pad 26 are situated close to the edge 10a of the insulating substrate 10, the first transistors Tr1 are situated on the first area 211 on the side toward the edge 10a. In this case, each of the first diodes Di1 is situated alongside a corresponding one of the first transistors Tr1 in the Y direction. Due to the fact that the third area 233 of the N pad 23 is situated close to the edge 10b of the insulating substrate 10, the first diodes Di1 are situated on the first area 211 on the side toward the edge 10b. It may be noted, however, that the arrangement of the plurality of first transistors Tr1 and the plurality of second transistors Tr2 may alternatively be the same as in the case of the semiconductor module 1 illustrated in FIG. 1 and FIG. 2.

The anodes AP of the first diodes Di1 are coupled to the second area 222 of the O pad 22 through the wires W4 as illustrated in FIG. 4, for example.

The semiconductor module 1A has at least the same effects and advantages as the semiconductor module 1 because the N pad 23 has the first area 231, and the first area 231 of the N pad 23 is electrically coupled to the first area 211 of the P pad 21 through the absorbing devices 30. Due to the fact that the third area 233 of the N pad 23 is coupled through the capacitors C to the first area 211 of the P pad 21, potential variation at the P pad 21 may be reduced. This enables the stabilization of power (e.g., voltage) applied to the lower electrodes DP of the first transistors Tr1. From this viewpoint, the capacitors C may have capacitances suitable for the stabilization of such a voltage.

<Second Variation>

Figure 6:
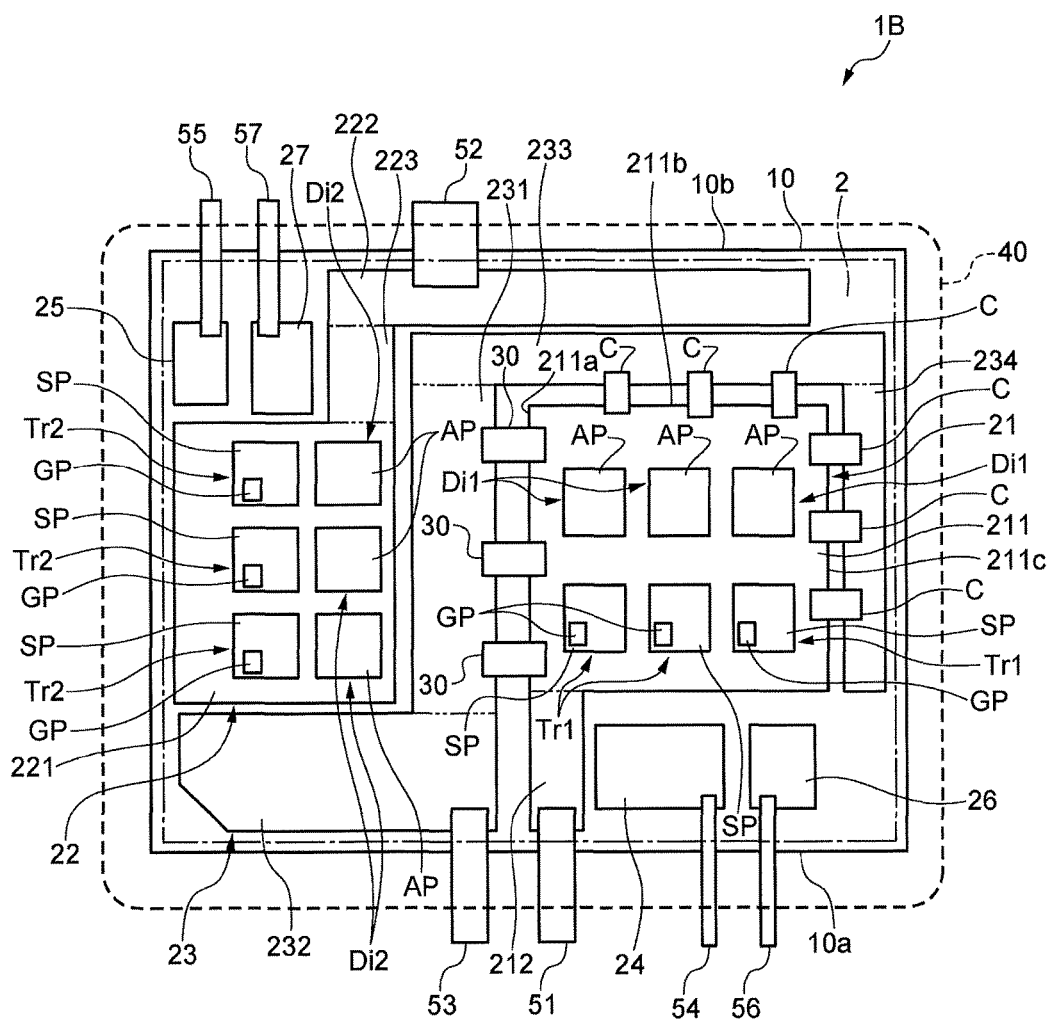
FIG. 6 is a plan view illustrating a schematic configuration of yet another example of the semiconductor module.
Figure 6:
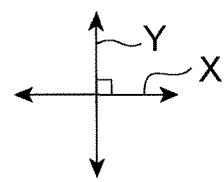

FIG. 6 is a schematic diagram of a semiconductor module 1B according to a second variation. The semiconductor module 1B differs from the configuration of the semiconductor module 1A of the first variation mainly in that the N pad 23 further includes a fourth area (i.e., capacitor connecting area) 234. The semiconductor module 1B will be described, with a focus on this difference. The interconnection structures for the plurality of first transistors Tr1 and the plurality of second transistors Tr2 are the same as or similar to those of the first variation, and illustration of the wires W1 through W8 is omitted in FIG. 6.

The fourth area 234 of the N pad 23 is connected to an end of the third area 233 opposite the first area 231, and is seamlessly connected with the third area 233. The area of the N pad 23 constituted by the first area 231, the third area 233, and the fourth area 234 surrounds the first area 211 of the P pad 21. As illustrated as an example in FIG. 6, when the first area 211 is a rectangular shape, the fourth area 234 is arranged in parallel to an edge 211c of the first area 211, and the area constituted by the first area 231, the third area 233, and the fourth area 234 is a letter-U shape.

The fourth area 234 and the first area 211 are coupled through the capacitors C. It suffices for the number of capacitors C to be one or more.

The semiconductor module 1B has at least the same effects and advantages as the semiconductor module 1A because the N pad 23 has the first area 231, and the first area 211 of the P pad 21 is coupled through the capacitors C to the third area 233 and to the fourth area 234.

<Third Variation>

Figure 7:
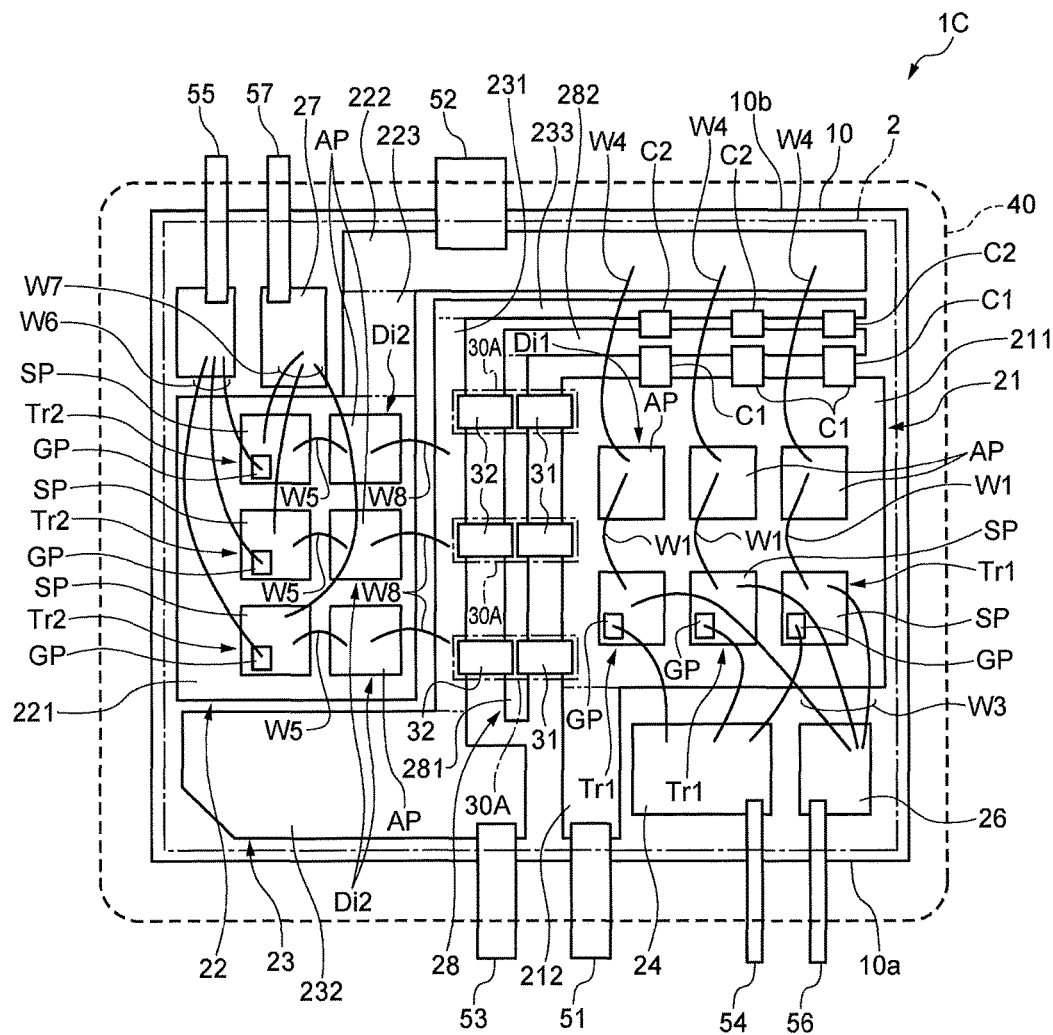
FIG. 7 is a plan view illustrating a schematic configuration of still another example of the semiconductor module.
Figure 7:
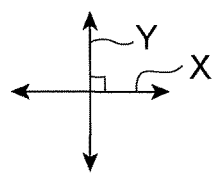
Figure 8:
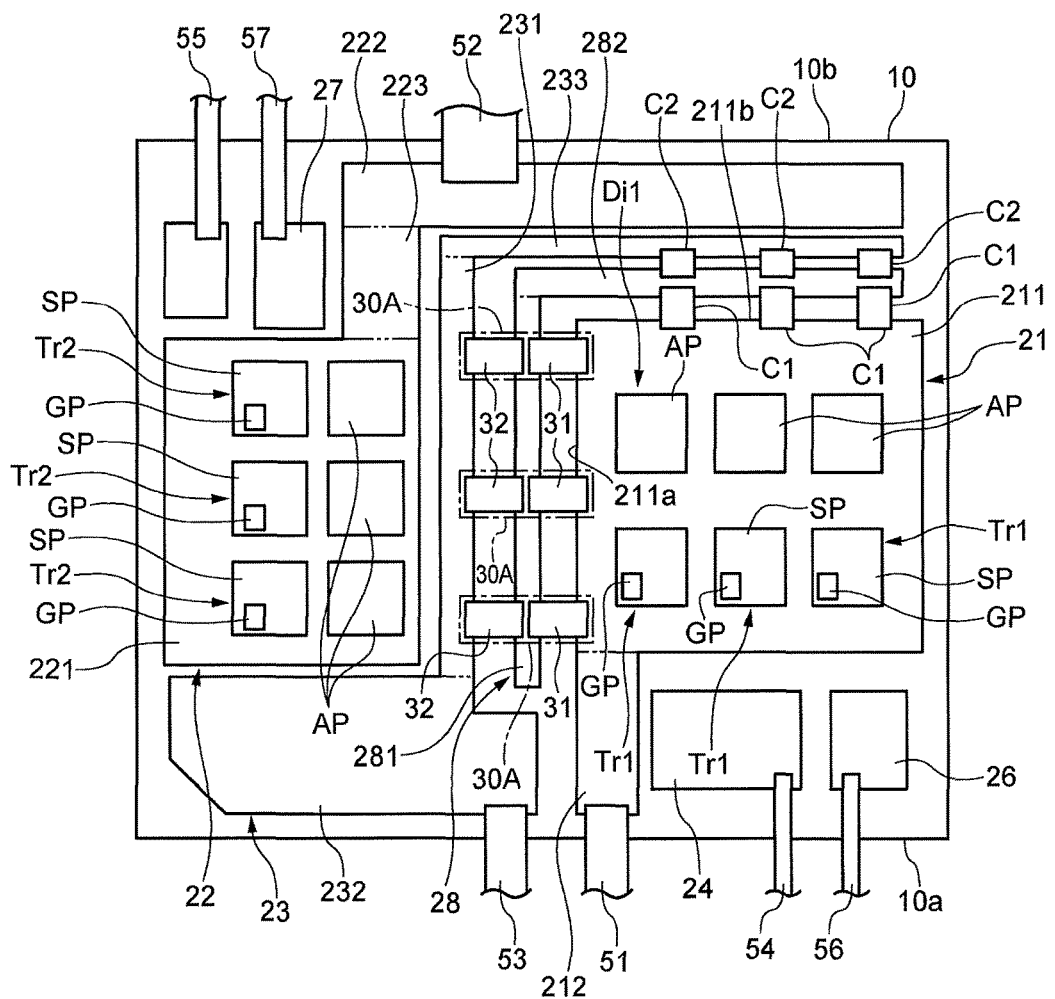
FIG. 8 is a schematic diagram of a configuration on an insulating substrate of the semiconductor module illustrated in FIG. 7.
Figure 8:
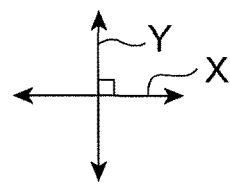

FIG. 7 is a schematic diagram of a semiconductor module 1C according to a third variation. FIG. 8 is a drawing schematically illustrating the configuration of the semiconductor module 1C on the insulating substrate 10 illustrated in FIG. 7. In FIG. 8, the wires W1 through W8 are omitted from the illustration. The configuration of the semiconductor module 1C differs from the semiconductor module 1A of the first variation mainly in that a third auxiliary pad 28 and absorbing devices 30A are provided. The semiconductor module 1C will be described, with a focus on this difference.

The third auxiliary pad 28, which has a first area 281 and a second area 282, serves as a floating pad. An example of the material of the third auxiliary pad 28 is copper. The first area 281 is situated between the first area 231 of the N pad 23 and the first area 211 of the P pad 21. The second area 282 is situated between the third area 233 of the N pad 23 and the first area 211 of the P pad 21. The third auxiliary pad 28 may have a similar shape to the area constituted by the first area 231 and the third area 233 of the N pad 23.

The second area 282 of the third auxiliary pad 28 and the first area 211 of the P pad 21 are coupled through capacitors C1. The second area 282 and the third area 233 of the N pad 23 are coupled through capacitors C2. Accordingly, the first area 211 and the third area 233 are electrically coupled through the capacitors C1 and c2. This enables the stabilization of power (e.g., voltage) applied to the lower electrodes DP of the first transistors Tr1. It suffices for the capacitors C1 and C2 to have capacitances enabling the stabilization of power (e.g., voltage) applied to the lower electrodes DP of the first transistors Tr1.

The absorbing devices 30A includes first circuit elements 31 and second circuit elements 32. Both the first circuit elements 31 and the second circuit elements 32 are capacitors. An example of capacitors is a ceramic capacitor. It suffices for the capacitors provided as the first circuit elements 31 and the second circuit elements 32 to have a capacitance capable of absorbing surge voltage. The first circuit elements 31 are connected to the first area 211 of the P pad 21 at one end thereof, and are connected to the first area 281 of the third auxiliary pad 28 at the other end thereof. The second circuit elements 32 are connected to the first area 281 of third auxiliary pad 28 at one end thereof, and are connected to the first area 231 of the N pad 23 at the other end thereof. With this arrangement, the first area 211 of the P pad 21 and the first area 231 of the N pad 23 are electrically coupled through the absorbing devices 30A.

In the semiconductor module 1C, the plurality of first transistors Tr1 are aligned at spaced intervals in the X direction as illustrated in FIG. 8. Due to the fact that the first control pad 24 and the first auxiliary pad 26 are situated close to the edge 10a of the insulating substrate 10, the first transistors Tr1 are situated on the first area 211 on the side toward the edge 10a. In this case, each of the first diodes Di1 is situated alongside a corresponding one of the first transistors Tr1 in the Y direction. Due to the fact that the third area 233 is situated close to the edge 10b of the insulating substrate 10, the first diodes Di1 are situated on the first area 211 on the side toward the edge 10b. It may be noted, however, that the arrangement of the plurality of first transistors Tr1 and the plurality of second transistors Tr2 may alternatively be the same as in the case of the semiconductor module 1 illustrated in FIG. 1 and FIG. 2.

The anodes AP of the first diodes Di1 are coupled to the second area 222 of the O pad 22 through the wires W4 as illustrated in FIG. 4, for example.

In the configuration of the semiconductor module 1C, the first area 211 of the P pad 21 and the first area 281 of the third auxiliary pad 28 are coupled to each other through the first circuit elements 31 as illustrated in FIG. 7 and FIG. 8. Further, the first area 281 of the third auxiliary pad 28 and the first area 231 of the N pad 23 are coupled to each other through the second circuit elements 32. With this arrangement, the first area 211 of the P pad 21 and the first area 231 of the N pad 23 are electrically coupled to each other through the absorbing devices 30A including the first circuit elements 31 and the second circuit elements 32.

The semiconductor module 1C has at least the same effects and advantages as the semiconductor module 1A because the N pad 23 has the first area 231, and the first area 231 of the N pad 23 and the first area 211 of the P pad 21 are electrically coupled to each other through the absorbing devices 30A.

A capacitor having a large capacitance typically has a low withstanding voltage. The fact that each of the absorbing devices 30A includes two series-connected capacitors, i.e., the first circuit element 31 and the second circuit element 32, ensures that each capacitor has a capacitance required to absorb surge voltage while having sufficient voltage tolerance as an absorbing device 30A. This is thus an effective configuration for the power semiconductor module 1C.

In the semiconductor module 1C, moreover, the first area 211 of the P pad 21 and the third area 233 of the N pad 23 are electrically coupled through the capacitors C1 and C2. This enables the stabilization of power (e.g., voltage)

applied to the lower electrodes DP of the first transistors Tr1 as in the case of the semiconductor module 1A.

The disclosed example has been directed to the configuration in which both the first circuit element 31 and the second circuit element 32 are capacitors. Notwithstanding this, either one of the first circuit element 31 and the second circuit element 32 may be a resistor. In this case, the absorbing device 30A serves as an RC circuit (or RC snubber element). The resistor may be a printed thin-film resistor.

In the configuration of the semiconductor module 1C, one of the capacitors C1 and C2 may be replaced with a resistor.

According to the present disclosures, surge voltage is reduced more reliably.

Although the embodiments and variations of the disclosed technology have heretofore been described, the present invention is not limited to these various disclosed embodiments, and various modifications may be made without departing from the scope of the present invention.

The power conversion circuit is not limited to a single-phase power conversion circuit such as a single-phase inverter circuit, and may alternatively be a two-phase or three-phase power conversion circuit 2. The exemplary number of transistors and the exemplary number of absorbing devices are not limited to the numbers illustrated in the drawings. The semiconductor module may have at least one first transistor and at least one second transistor. Similarly, the semiconductor module may have at least one absorbing device.

The arrangement of the first transistors Tr1 and the second transistors Tr2 and the interconnection structures between the first transistors Tr1, the second transistors Tr2, and the various pads (i.e., the P pad, the N pad, the O pad, and the like) are not limited to those shown in the examples, and are preferably optimized in such a manner as to minimize the wire inductance for the purpose of reducing surge voltage.

In the disclosed embodiments, a configuration in which the P pad 21 is the positive-voltage side and the N pad 23 is the negative-voltage side has been described as an example. Alternatively, the pad 21 having the transistors Tr1 mounted thereon may be the negative-voltage side, and the pad 23 having no transistors mounted thereon may be the positive-voltage side.

DESCRIPTION OF REFERENCE SYMBOLS 1, 1A, 1B, 1C . . . semiconductor module
2 . . . power conversion circuit,
10 . . . insulating substrate
21 . . . P pad (first input interconnection pattern)
22 . . . O pad (output interconnection pattern)
23 . . . N pad (second input interconnection pattern)
28 . . . third auxiliary pad (auxiliary interconnection pattern)
30, 30A . . . absorbing device (surge voltage absorbing device)
31 . . . first circuit elements
32 . . . second circuit elements
51 . . . P terminal (positive-side input terminal)
52 . . . O terminal (output terminal)
53 . . . N terminal (negative-side input terminal)
211 . . . first area (first transistor mounting area)
221 . . . first area (second transistor mounting area)
231 . . . first area (absorbing device connecting area)
233 . . . third area (capacitor connecting area)
234 . . . fourth area (capacitor connecting area)

The invention claimed is:

1. A semiconductor module including a power conversion circuit, comprising:
    an insulating substrate;
    a first transistor constituting an upper arm of the power conversion circuit;
    a second transistor constituting a lower arm of the power conversion circuit and electrically series-coupled to the first transistor;
    a first input interconnection pattern disposed on the insulating substrate and coupled to a positive-side input terminal for supplying positive power to the power conversion circuit;
    a second input interconnection pattern disposed on the insulating substrate and coupled to a negative-side input terminal for supplying negative power to the power conversion circuit;
    an output interconnection pattern disposed on the insulating substrate and coupled to an output terminal for outputting output power of the power conversion circuit; and
    an absorbing device configured to absorb surge voltage in the power conversion circuit,
    wherein the first input interconnection pattern includes a first-transistor mounting area on which the first transistor is mounted,
    wherein the output interconnection pattern includes a second-transistor mounting area on which the second transistor is mounted,
    wherein the second input interconnection pattern includes an absorbing-device connecting area that is disposed between the first-transistor mounting area and the second-transistor mounting area,
    wherein the absorbing-device connecting area is electrically coupled to the first-transistor mounting area through the absorbing device,
    wherein the second input interconnection pattern includes a capacitor connecting area seamlessly connected to an end of the absorbing-device connecting area,
    wherein the absorbing-device connecting area and the capacitor connecting area are disposed on the insulating substrate such as to surround the first-transistor mounting area, and
    wherein the capacitor connecting area is electrically coupled to the first-transistor mounting area through a capacitor.

2. The semiconductor module as claimed in claim 1, comprising:
    a plurality of said first transistors; and
    a plurality of said second transistors,
    wherein the plurality of first transistors are mounted on the first-transistor mounting area, and are electrically coupled in parallel, and
    wherein the plurality of second transistors are mounted on the second-transistor mounting area, and are electrically coupled in parallel.

3. The semiconductor module as claimed in claim 1, comprising a plurality of said absorbing devices, wherein the plurality of absorbing devices are disposed at spaced intervals.

4. A semiconductor module including a power conversion circuit, comprising:
    an insulating substrate;
    a first transistor constituting an upper arm of the power conversion circuit;

a second transistor constituting a lower arm of the power conversion circuit and electrically series-coupled to the first transistor;

a first input interconnection pattern disposed on the insulating substrate and coupled to a positive-side input terminal for supplying positive power to the power conversion circuit;

a second input interconnection pattern disposed on the insulating substrate and coupled to a negative-side input terminal for supplying negative power to the power conversion circuit;

an output interconnection pattern disposed on the insulating substrate and coupled to an output terminal for outputting output power of the power conversion circuit; and an absorbing device configured to absorb surge voltage in the power conversion circuit, wherein the first input interconnection pattern includes a first-transistor mounting area on which the first transistor is mounted, wherein the output interconnection pattern includes a second-transistor mounting area on which the second transistor is mounted, wherein the second input interconnection pattern includes an absorbing-device connecting area that is disposed between the first-transistor mounting area and the second-transistor mounting area, and wherein the absorbing-device connecting area is electrically coupled to the first-transistor mounting area through the absorbing device, the semiconductor module further comprising an auxiliary interconnection pattern disposed on the insulating substrate between the absorbing-device connecting area and the first-transistor mounting area, wherein the absorbing device includes a first circuit element and a second circuit element, wherein the first circuit element electrically couple the auxiliary interconnection pattern and the first-transistor mounting area, and wherein the second circuit element electrically couple the auxiliary interconnection pattern and the absorbing-device connecting area.

5. The semiconductor module as claimed in claim 4, comprising:

a plurality of said first transistors; and a plurality of said second transistors, wherein the plurality of first transistors are mounted on the first-transistor mounting area, and are electrically coupled in parallel, and wherein the plurality of second transistors are mounted on the second-transistor mounting area, and are electrically coupled in parallel.

6. The semiconductor module as claimed in claim 4, comprising a plurality of said absorbing devices, wherein the plurality of absorbing devices are disposed at spaced intervals.

* * * * *